| United States Patent [19] | [11] | 4,216,035 |
|---|---|---|
| Bakos et al. | [45] | Aug. 5, 1980 |

[54] REMOVABLE PROTECTIVE COATING AND PROCESS OF USING SAME

[75] Inventors: Peter Bakos; Roger E. Haggett, both of Endicott; Richard M. Poliak, Endwell, all of N.Y.

[73] Assignee: International Business Machines Corporation, Armonk, N.Y.

[21] Appl. No.: 864,073

[22] Filed: Dec. 23, 1977

[51] Int. Cl.$^2$ ............................................. B23K 35/34
[52] U.S. Cl. .................................... 148/23; 148/25
[58] Field of Search ................................ 148/23–25

[56] References Cited

U.S. PATENT DOCUMENTS

| 2,090,846 | 8/1937 | Lawson | 148/25 |
|---|---|---|---|
| 2,445,431 | 7/1948 | Hill | 148/25 |
| 2,473,579 | 6/1949 | Eubank | 148/23 |
| 2,480,723 | 8/1949 | Evans | 148/24 |
| 2,482,923 | 9/1949 | McCoy | 148/23 |
| 2,672,681 | 3/1954 | Klain | 29/360 |
| 2,898,255 | 8/1959 | Thompson | 148/23 |
| 3,075,486 | 1/1962 | Laubmeyer | 113/110 |
| 3,205,052 | 9/1965 | Downing | 29/195 |
| 3,206,324 | 9/1965 | Daesen | 117/51 |
| 3,235,414 | 2/1966 | Marks | 148/23 |
| 3,264,146 | 8/1966 | Marks | 148/23 |
| 3,412,113 | 11/1968 | Fitch | 260/403 |
| 3,424,625 | 1/1969 | Tiegel | 148/23 |
| 3,436,278 | 4/1969 | Poliak | 148/23 |
| 3,791,027 | 2/1974 | Angelo | 148/23 |
| 3,832,242 | 8/1974 | Cuthbert | 148/23 |
| 3,837,932 | 9/1974 | Aronberg | 148/23 |
| 3,895,973 | 7/1975 | Stayner | 148/23 |
| 3,944,123 | 3/1976 | Jacobs | 148/23 |
| 3,960,613 | 6/1976 | Stayner | 148/23 |
| 3,970,239 | 7/1976 | Hill | 148/23 |
| 4,028,143 | 6/1977 | Stayner | 148/23 |

*Primary Examiner*—P. D. Rosenberg
*Attorney, Agent, or Firm*—Pollock, Vande Sande and Priddy

[57] ABSTRACT

A film-forming composition comprising an organic flux base material; and a carboxylic acid anhydride and/or aldehyde; and a process for using are provided.

31 Claims, No Drawings

(54)

REMOVABLE PROTECTIVE COATING AND PROCESS OF USING SAME

FIELD OF THE INVENTION

The present invention is concerned with removable protective coating compositions and their use in the preparation of integrated circuit modules. In particular, the compositions of the present invention are film-forming and are capable of being removed by simple solvent treatment after they have served their intended purpose. Compositions of the present invention also exhibit fluxing characteristics.

BACKGROUND OF THE INVENTION

During the preparation of integrated circuit modules, an encapsulating or potting composition such as an epoxy formulation is applied to hermetically seal the backside of the module. During the curing of the potting composition, unwanted residue therefrom is deposited on the input/output (I/O) pins of the module. This residue if not adequately removed can cause poor electrical conductivity which can render the electrical connections into, for instance, a printed circuit board somewhat unreliable. Prior to the present invention, it has been necessary to either scrub or burn the pins in order to remove as much as possible of the residue. Scrubbing, however, can physically damage the pins. Also, the closer pins are located to each other on a chip or module, the more difficult it is to get between them for scrubbing. Burning, on the other hand, is not entirely satisfactory since it exposes the device to excessive heat which can adversely affect the performance of the device.

Accordingly, it is an object of the present invention to provide means which significantly reduces if not completely eliminates residue from tenaciously adhering to the pins, and which greatly facilitates the removal thereof. The present invention offers the advantage that only a simple washing is needed after the backseal operation to clean the pins.

When the module is to be connected to a printed circuit board by a soldering process, flux compositions have been applied to the pins. Flux compositions are employed to remove oxides from the pins and to prevent the pins from oxidizing when subjected to elevated temperature thereby serving to maintain the electrical conductivity of the pins. It has been found, according to the present invention, that the compositions which have been found by applicants to be suitable for preventing the build-up of residue on the pins during the backsealing operation also can function as a fluxing composition.

Although numerous flux compositions have been suggested in the prior art, applicants are not aware of any such compositions which have also been employed on a commercial basis to act as a temporary protective coating on conductive pins to prevent the formation of tenacious residue due to the backsealing operation.

SUMMARY OF THE INVENTION

The present invention is concerned with a film-forming composition which is readily removable from an electrically conductive substrate by washing with a solvent. The composition includes an organic flux base material, and an organic carboxylic acid anhydride, and/or an aldehyde in an amount sufficient to promote wetting of the composition to the desired substrate. The base material and anhydride and/or aldehyde are mutually soluble in each other in the quantities employed.

The present invention is also concerned with a process for preparing an integrated circuit module which includes the following steps:

(A) providing a substrate which contains electrically conductive pins protruding therefrom;
(B) coating the pins with the film-forming composition described hereinabove;
(C) applying a bonding and encapsulating agent over the substrate and over a portion of the height of the pins;
(D) curing the bonding agent; and
(E) removing the film-forming composition from the pins by washing with a solvent.

Although certain anhydrides have been suggested in fluxing compositions, particularly as the fluxing material, none of these prior uses of the anhydrides provides a film-forming composition which performs the functions required by the present invention. Of interest along these lines are U.S. Pat. Nos. 2,473,579 to Eubank, 2,672,681 to Klain, 3,235,414 to Marks, 3,264,146 to Marks, 3,412,113 to Fitch et al, 3,791,027 to Angelo et al, and 3,970,239 to Hill.

For instance, U.S. Pat. Nos. 2,672,681, 3,235,414, 3,264,146, and 3,970,239 suggest various anhydrides as the primary flux material in a flux composition employed for soldering. However, none of these particular patents suggests combining the anhydrides with another base flux material. U.S. Pat. No. 3,791,027 suggests various types of flux compositions, one of which includes compositions which do not harden and which can be readily removed with solvents. Such compositions can include an anhydride along or admixed with a solvent such as diethylene glycol monoethyl ether (for instance, see column 3, lines 39-52, and column 4, lines 6-11 and 15). Also, U.S. Pat. No. 2,473,579 suggests the use of phthalic anhydride as a foaming agent in a flux composition which must include certain chlorides. However, there is no suggestion that these particular flux compositions will be film-forming to the extent that they can protect the pins during the backsealing operation.

In addition, U.S. Pat. No. 3,412,113 suggests certain anhydrides of organic phosphonic acids and suggests that the anhydrides are reactive toward metal oxides and may be used as metal cleaners. The patent further suggests that the anhydrides can be used in soldering pastes and fluxes in that they serve to clean the metal surface and insure a well-bonded soldered joint (see column 3, lines 29-33).

With respect to discussions of aldehydes, U.S. Pat. Nos. 2,090,846 to Lawson and 3,206,324 to Daeson are of interest. U.S. Pat. No. 2,090,846 suggests flux compositions in general which include higher acids, esters, amides, aldehydes, ketones, and alcohols. However, this patent does not suggest combining an aldehyde with another flux material as required by the present invention nor does it suggest any particular advantage of employing an aldehyde as opposed to an acid, which is not suitable for the purposes of the present invention. Moreover, the particular unique combination of properties achieved by the present invention is not suggested by this prior art. U.S. Pat. No. 3,206,324 suggests the use of aldehydes in flux compositions for treating certain metals to deposit nickel thereon where the aldehydes are employed to reduce metal from the aqueous solutions. The function of the aldehyde according to this patent is quite different from that of the present invention.

Various organic carboxylic acids have been suggested as additives to flux compositions such as an activator therein. However, acids do not perform the same function as the anhydride or aldehyde in the compositions of the present invention since film-forming compositions capable of preventing residue deposition are not achieved when using an acid. Of interest along these lines are U.S. Pat. Nos. 3,436,278 to Poliak, 3,796,610 to Sarnacki et al, 2,898,255 to Thompson et al, and 3,205,052 to Downing.

Also of interest with respect to flux compositions in general are U.S. Pat. Nos. 2,480,723 to Evans et al, 2,482,923 to McCoy, and 3,075,486 to Laubmeyer et al which are representative of the prior art which suggests the use of a plasticizer in combination with a flux material in providing a flux composition. The use of a plasticizer in the present invention is a preferred aspect.

In addition, according to a preferred aspect of the present invention, certain polymeric materials are added to enhance the film-forming characteristics of the composition. Prior art which is of interest concerning polymer additives include U.S. Pat. Nos. 3,837,932 to Aronberg and 3,791,027 to Angelo et al. U.S. Pat. No. 3,837,932 suggests a flux composition which comprises an aqueous suspension of a polycarboxylic acid and a water-soluble polymer such as polyvinyl pyrrolidone. U.S. Pat. No. 3,791,027 suggests flux compositions which can employ Gantrex GAF as the flux material.

DESCRIPTION OF PREFERRED EMBODIMENTS

The organic flux base material employed according to the present invention can be any of the known base materials used in flux compositions. It should be soluble in the liquid to be used in the washing of the pins and includes the polyalkylene glycols, and the polyoxyalkylene ethers. It is preferred that the base material be sufficiently water-soluble or alcohol soluble that the final film-forming composition can be removed from the pins by washing with either water or an alcohol such as methanol or ethanol.

The alkylene moieties of the preferred base material employed in the present invention include ethylene, propylene and butylene or mixtures thereof and most preferably ethylene. Also, the preferred base materials employed in the present invention have molecular weights from about 200 to about 6000. These materials are specially suitable for purposes of the present invention since they possess high temperature stability, the necessary viscosity requirements and have high flash points (e.g., above about 360° F.). Some commercially available base materials suitable for the present invention include Carbowax 300 monostearate form, [HO(CH$_2$CH$_2$O)$_5$ CH$_2$CH$_2$OOC(CH$_2$)$_{16}$ CH$_3$]; Carbowax 400—monolaurate form [HO(CH$_2$CH$_2$O)$_8$ CH$_2$CH$_2$OOC(CH$_2$)$_{10}$ CH$_3$]; and Carbowax 400 monooleate form [C$_{36}$H$_{70}$O$_{11}$]. An example of a polyoxyalkylene ether is one commercially available from Dow Chemical Company under the designation P-15-200. P-15-200 is a polyoxyalkylene ether containing methyl side chains and terminal hydroxyl groups. The figure "200" following the "15" designates the viscosity of the material in centistokes and 100° F.

These materials are preferred since compositions containing them melt when the coated pins are exposed to the elevated temperatures experienced during application of solder material, and accordingly, such compositions can also be used as a flux.

Other suitable base materials include rosin and shellac which are alcohol soluble. The base material and the anhydride and/or aldehyde must be mutually soluble with each other in the amounts used in the present invention.

The next essential component of the composition is an anhydride and/or aldehyde. The anhydride can be an anhydride of a mono or polycarboxylic acid. The carboxylic acid anhydride can be saturated or ethylenically unsaturated and aliphatic, cycloaliphatic, or aromatic. Exemplary of some suitable anhydrides include acetic anhydride, propionic anhydride, n-butyric, n-valeric anhydride, stearic anhydride, succinic anhydride, benzoic anhydride, phthalic anhydride, maleic anhydride, nadic anhydride, tartaric anhydride, citraconic anhydride, glutaric anhydride, polysebacic anhydride and trimellitic anhydride. The anhydride must be mutually soluble with the base material in the amounts used. The combination of the base material and anhydride and/or aldehyde must be soluble in the washing liquid. Mixtures of anhydrides can be employed when desired. The anhydride employed is generally an anhydride of an acid which contains no more than about 18 carbon atoms.

It is believed that the anhydride interacts with the base material such as the polyethylene glycol or derivative thereof and possibly aids in cross-linking individual molecules in order to promote the film-forming characteristics and properties of the composition. On the other hand, it has been observed that the use of an acid in place of the corresponding anhydride does not provide the necessary film-forming characteristics achieved by the present invention.

The aldehydes preferred in the present invention are represented by the general formula RCHO wherein R is an aliphatic hydrocarbon group or an aromatic group such as benzene or naphthaline or a substituted benzene including alkoxy substituted rings. It is preferred that the aldehydes can be soluble in water. The aldehyde must be mutually soluble with the base materials in the amount used. Aldehydes having 5 or more carbon atoms are only slightly soluble in water but are readily soluble in alcohol and ketone solvents. Accordingly, when such aldehydes are employed, the washing step can be conducted utilizing an alcohol and/or acetone solvent. Exemplary of some suitable aldehydes include acetaldehyde, propionaldehyde, butyraldehyde, isobutyraldehyde, benzaldehyde, and anisaldehyde. Mixtures or aldehydes can be used when desired. The aldehydes employed generally contain no more than about 18 carbon atoms.

In order to facilitate coating of the pins and to assure complete coverage thereof, it is desirable to reduce the viscosity of the composition during the coating by employing a nonreactive diluent. Examples of some suitable diluents include saturated aliphatic alcohols such as methanol, ethanol, n-propanol, isopropylalcohol and n-butylalcohol; and the various cellosolves (glycol monoalkylethers) such as butyl cellosolve, ethyl cellosolve, methyl cellosolve, n-hexyl cellosolve, cellosolve acetate, and dibutyl cellosolve. Other suitable solvents include ketones such as acetone and methylethylketone. When the diluent is present, it is usually employed in amounts from about 50 to about 85.5 percent by weight and preferably at least about 60 percent by weight.

In addition to the above ingredients, it is preferred to employ a small amount of a synthetic polymer to improve the film-forming characteristics of the composition. Preferably, the polymer is water soluble. The polymers employed must be thermoplastic and must not react with the anhydride and/or aldehyde present in the composition. Moreover, the polymers should be miscible with the base material. The preferred polymers have molecular weight from about 35,000 to about 150,000, and preferably about 50,000 to 100,000. The preferred polymers possess a weak basic character (e.g., forming salts with anhydrous acids). Exemplary of suitable polymers include polyvinylpyrrolidone, acrylate polymers such as polymethyl methacrylate, maleic anhydride-vinyl ether polymers such as Gantrex GAF, and the fluoropolymers disclosed in U.S. Pat. No. 3,734,791, disclosure of which is incorporated herein by reference. One particular fluoropolymer is represented by the formula $F(CF_2)_7CONHC_3H_6N(C_2H_5)CH_3I$. It should be noted that the function of the fluoropolymers is not entirely the same as that of some of the other polymers employed in the present invention such as polyvinylpyrrolidone. For instance, polyvinylpyrrollidone improves the physical properties or film-forming characteristics of the composition. When present, the polymeric material is generally employed in amounts from about 0.2 to about 1 percent by weight based on the total weight of the composition.

For the best performance, the compositions of the present invention also include a plasticizer to ensure that the film is sufficiently flexible so as to eliminate cracks therein. Examples of some suitable plasticizers include the phthalates, adipates, amines, camphor, and the sulfonamides. The preferred phthalates in the present invention contain from about 14 to about 39 carbon atoms and have molecular weights from about 246 to about 531. Examples of some suitable phthalate plasticizers include diallyl phthalate, diallylisophthalate, dibutyl phthalate, diamyl phthalate, diethyl phthalate, dimethyl phthalate, dipropyl phthalate, and ditridecyl phthalate. The preferred phthalate employed according to the present invention is diallyl phthalate. Examples of suitable amines include the alkanol amines such as monoethanolamine, diethanolamine, and preferably triethanolamine and the alkylamines such as diethylamine. An example of a suitable sulfonamide is methyl N-nitrosoparatoluene sulfonamide. When present, the plasticizer is employed in amounts between about 0.2 and about 1 percent by weight.

The compositions of the present invention can optionally include up to about 5 percent by weight of a polycarboxylic acid or a mono or polycarboxylic acid which also contains a hydroxyl group. The preferred carboxylic acids are water-soluble and should be compatible with the base material. The acids enhance the oxide removal when the compositions are subjected to the conditions of soldering and therefore are employed for its flux characteristics. Examples of some suitable polycarboxylic acids include oxalic acid, malonic, succinic, glutaric, adipic, pimelic, suberic, and maleic. The acids can be saturated or unsaturated. Examples of some acids which contain a hydroxyl group are malic acid, tartaric acid, and citric acid. The (−) form of malic acid is the more water soluble of the malic acids.

It is preferred that the pH of the total composition be between about 6 and about 7 so as not to damage the sensitive components of the module.

It has been found that the compositions of the present invention can be readily prepared by obtaining two premixes and then mixing those together as follows:

|  |  | Approximate Parts by Weight |
|---|---|---|
| 1st premix | base flux material | 5–30 |
|  | diluent | 40–50 |
|  | plasticizer | 0.2–1 |
| 2nd premix | anhydride and/or aldehyde | 10–30 |
|  | diluent | 20–40 |
|  | polymer | 0.2–1 |

The compositions can be coated onto the metal pins by any of the conventional methods of coating such as by spraying, dipping, spinning and flow-coating. The coatings should be coated onto the pins' surfaces only on that portion which is to protrude out from the encapsulating composition and not on that portion which will be covered with the encapsulating composition. The coating can conveniently be carried out at temperatures from about room temperature to about 90° C. One convenient way for coating the pins is to impregnate a sponge to a predetermined desired level. After the pins are coated and removed from the sponge, the module is inverted so that it is in proper position for the subsequent back-sealing operation.

Since the coating composition must not cover that portion of the pins which will in turn be coated by the encapsulating composition, it is essential that the coating composition not drip down the pins towards that portion which will be subsequently covered by the encapsulating or potting composition. That area of the pins to be covered by the potting or encapsulating composition is generally referred to as the "stand-off" area of the pins. Since none of the prior art compositions are now being employed to prevent the deposition of residue due to the backsealing operation, there is no suggestion to apply the composition to the pins prior to the backsealing operation. All of the flux compositions known are applied after the backseal operation occurs. As discussed hereinabove, it is essential that the composition not flow but remain in place on the pins if such are to be usable prior to application of the backsealing operation.

Next, a potting or encapsulating composition is applied to the module up to the stand-off area in order to protect and seal the electrically active portions of the module. Such encapsulating compositions are well known in the art and need not be described herein in any great detail. Exemplary of such compositions include epoxies, room temperature curable silicones, polyesters (e.g., usasol), and teflon. One particular type of encapsulating material is an epoxy composition available under the tradename "Scotchcast." Exemplary of such, a composition is composed of about 45.7 percent by weight of an epoxy resin such as a bisphenol A-epichlorohydrin adduct, cis-1,2-cyclohexane dicarboxylic anhydride, and a pigment dye such as Hysol color dispersion. The encapsulating composition, depending upon its chemical identity, is cured at room temperature or temperatures up to about 125° C. for between about ½ to about 6 hours.

According to the present invention, after the encapsulating composition is cured, the pins are washed clean so as to remove any of the residue from the pins and to remove the above-defined coating composition. The residue and coating composition are removed simply by washing with a suitable solvent such as water or a lower alcohol such as methanol, ethanol, or butanol, or a ketone such as acetone. The preferred processes of the present invention employ water as the washing material.

The pins can also be subjected to a dip or wave solder operation. In this type of process, the pins are coated with a soldering material such as a tin-lead (63-37 eutectic) in a bath at about 580° C. for a few seconds. When a solder operation is employed, the pins are again coated with a conventional flux composition or with a composition of the present invention. The composition in this instance acts as a fluxing material to prevent and remove oxides from the pins during the wave soldering operation. The solder in this instance replaces the composition during treatment since it melts the coating.

The encapsulating composition can be postcured such as heating to about 150° C. for about ½ to 2 hours.

The following nonlimiting examples are presented to further illustrate the present invention.

EXAMPLE 1

A premix of about 14 parts by weight of a solid polyethylene glycol (carbowax 1500), about 40 parts by weight of propyl alcohol, and about 0.5 parts by weight of diallyl phthalate is combined with a second premix of about 13 parts by weight of maleic anhydride, about 32 parts by weight of acetone and about 0.4 parts by weight of polyvinyl pyrrolidone.

A sponge is then impregnated with the composition. The pins from an integrated circuit module are inserted into the sponge up to the stand-off area to uniformly coat the pins with the above composition. Next, the module is removed from the sponge and inverted so that pins are facing upward. An epoxy encapsulating composition is applied to the module covering the substrate and a portion of the height of the pins up to the stand-off area. The epoxy composition contains about 45.7 percent by weight of a bisphenol A-epichlorohydrin epoxide, about 52.5 percent by weight of cis-1,2-cyclohexane dicarboxylic anhydride, and about 1.8 percent by weight of hysol color dispersion. The epoxy is cured by heating at about 20 minutes at about 120° C. The pins are next washed with water in order to remove any residue from the curing of the epoxy and to remove the above coating composition. The pins are then recoated with the above composition by spray coating after which they are dipped into a solder bath of a tin/lead 63-37 eutectic at about 580° C. for about 3 minutes. The solder displaces the composition.

Next, the module is subjected to a final cure of about 150° C. for about ½ hour.

Upon inspection, it is observed that the pins are free of any residue.

EXAMPLE 2

Example 1 is repeated except that about 0.6 parts by weight of d-champor is employed in place of the diallyl phthalate. The results obtained are similar to those of Example 1.

EXAMPLE 3

Example 1 is repeated except that about 0.6 parts by weight of triethanol amine is employed in place of the diallyl phthalate. The results obtained are similar to those of Example 1.

What is claimed is:

1. A film-forming composition which is readily removable from a substrate by washing with a solvent which comprises:
   (A) an organic flux material selected from the group of shellac, rosin, polyalkylene glycol, polyalkylene glycol monoester, polyalkylene glycol monoether, and mixtures thereof; and
   (B) a component selected from the group consisting of organic carboxylic acid anhydride, aldehyde and mixtures thereof in an amount sufficient to promote wetting of the film-forming composition, and wherein said flux base material and said component are mutually soluble with each other.

2. The composition of claim 1 wherein said flux material is water soluble to the extent that said composition is readily removable from a substrate by washing with water.

3. The composition of claim 1 wherein said flux material is selected from the group of polyalkylene glycol, polyalkylene glycol monoester, polyalkylene glycol monoether, and mixtures thereof.

4. The composition of claim 3 wherein said flux material is selected from the group of polyethylene glycol having molecular weight of between about 200 and 6000, polyethylene glycol monoester having molecular weight of between about 200 and 6000, polyethylene glycol monoether having a molecular weight of between about 200 and 6000, and mixtures thereof.

5. The composition of claim 1 wherein said component is an organic carboxylic acid anhydride.

6. The composition of claim 1 wherein said component is maleic anhydride.

7. The composition of claim 1 wherein said component is an aldehyde.

8. The composition of claim 7 wherein said aldehyde is water-soluble.

9. The composition of claim 1 which contains about 5 to about 30% by weight of said flux material and about 10 to about 30% by weight of said component.

10. The composition of claim 1 which further includes a nonreactive diluent.

11. The composition of claim 10 wherein said diluent is selected from the group consisting of alcohols, cellosolves, ketones, and mixtures thereof.

12. The composition of claim 10 wherein said diluent is present in amounts from about 50 to about 85.5% by weight.

13. The composition of claim 12 wherein said diluent is present in an amount of at least 60% by weight.

14. The composition of claim 1 which further includes a synthetic thermoplastic polymer.

15. The composition of claim 14 wherein said polymer is water-soluble and has a molecular weight between about 35,000 and 150,000.

16. The composition of claim 14 wherein said polymer is present in an amount from about 0.2 to about 1% by weight.

17. The composition of claim 1 which further includes a plasticizer.

18. The composition of claim 17 wherein said plasticizer is a phthalate having about 14 to about 38 carbon atoms.

19. The composition of claim 17 wherein said plasticizer is diallyl phthalate.

20. The composition of claim 17 wherein said plasticizer is camphor.

21. The composition of claim 17 wherein said plasticizer is an amine.

22. The composition of claim 17 wherein said plasticizer is triethanolamine.

23. The composition of claim 17 wherein said plasticizer is present in amounts from about 0.2 to about 1.0% by weight.

24. The composition of claim 1 which includes about 5 to about 30% by weight of said flux material, about 10 to about 30% by weight of said component, about 50 to about 85.5% by weight of a nonreactive diluent, about 0.2–1% by weight of a plasticizer and about 0.2–1% by weight of a polymer different from the flux material.

25. The composition of claim 1 wherein said component is an anhydride of an acid which contains no more than about 18 carbon atoms.

26. The composition of claim 7 wherein said aldehyde contains no more than about 18 carbon atoms.

27. The composition of claim 24 wherein said polymer is capable of forming a salt with an anhydrous acid.

28. The composition of claim 27 wherein said polymer is polyvinylpyrrolidone.

29. The composition of claim 14 wherein said polymer is polyvinylpyrrolidone.

30. The composition of claim 1 which further includes up to about 5% by weight of an acid from the group of polycarboxylic acids, monocarboxylic acids which contain a hydroxyl group, polycarboxylic acids which contain a hydroxyl group, and mixtures thereof.

31. The composition of claim 1 wherein the pH is about 6 to about 7.

* * * * *

UNITED STATES PATENT AND TRADEMARK OFFICE
CERTIFICATE OF CORRECTION

PATENT NO. : 4,216,035
DATED : August 5, 1980
INVENTOR(S) : Bakos et al

It is certified that error appears in the above—identified patent and that said Letters Patent is hereby corrected as shown below:

Column 1, line 30, insert --the-- between the words "closer" and "pins".

Column 4, line 40, change "naphthaline" to --naphthalene--.

Column 7, line 43, change "hysol" to --Hysol--; and line 59, change "d-champor" to --d-camphor--.

Signed and Sealed this

Third Day of November 1981

[SEAL]

Attest:

GERALD J. MOSSINGHOFF

Attesting Officer   Commissioner of Patents and Trademarks